United States Patent
Kodaira

[11] Patent Number: 6,046,484
[45] Date of Patent: Apr. 4, 2000

[54] GATE STRUCTURE OF SEMICONDUCTOR MEMORY

[75] Inventor: Yasunobu Kodaira, Kanagawa-ken, Japan

[73] Assignee: Kabushiki Kaisha Toshiba, Kawasaki, Japan

[21] Appl. No.: 09/055,946

[22] Filed: Apr. 7, 1998

[30] Foreign Application Priority Data

Apr. 8, 1997 [JP] Japan ................................. 9-103982

[51] Int. Cl.[7] .......................... H01L 29/76; H01L 29/94; H01L 27/088
[52] U.S. Cl. ............................................ 257/408; 257/900
[58] Field of Search .................... 257/408–412, 257/900, 350–35, 366–368

[56] References Cited

U.S. PATENT DOCUMENTS

| | | | |
|---|---|---|---|
| 4,907,048 | 3/1990 | Huang | 257/900 |
| 5,097,301 | 3/1992 | Sanchez | 257/408 |
| 5,158,903 | 10/1992 | Hori et al. | 257/408 |

*Primary Examiner*—Tom Thomas
*Assistant Examiner*—Cuong Quang Nguyen
*Attorney, Agent, or Firm*—Finnegan, Henderson, Farabow, Garrett & Dunner, L.L.P.

[57] ABSTRACT

An improved semiconductor memory device comprising memory cell areas including driving transistors having capacitors with increased capacitance. The driving transistors comprise a gate insulating film formed on a semiconductor substrate, a lower gate electrode formed on the gate insulating film, an upper gate electrode having a size smaller than the lower gate electrode and formed on the lower gate electrode, and an insulating film formed on the lower gate electrode so as to contact with a side wall of the upper gate electrode.

14 Claims, 8 Drawing Sheets

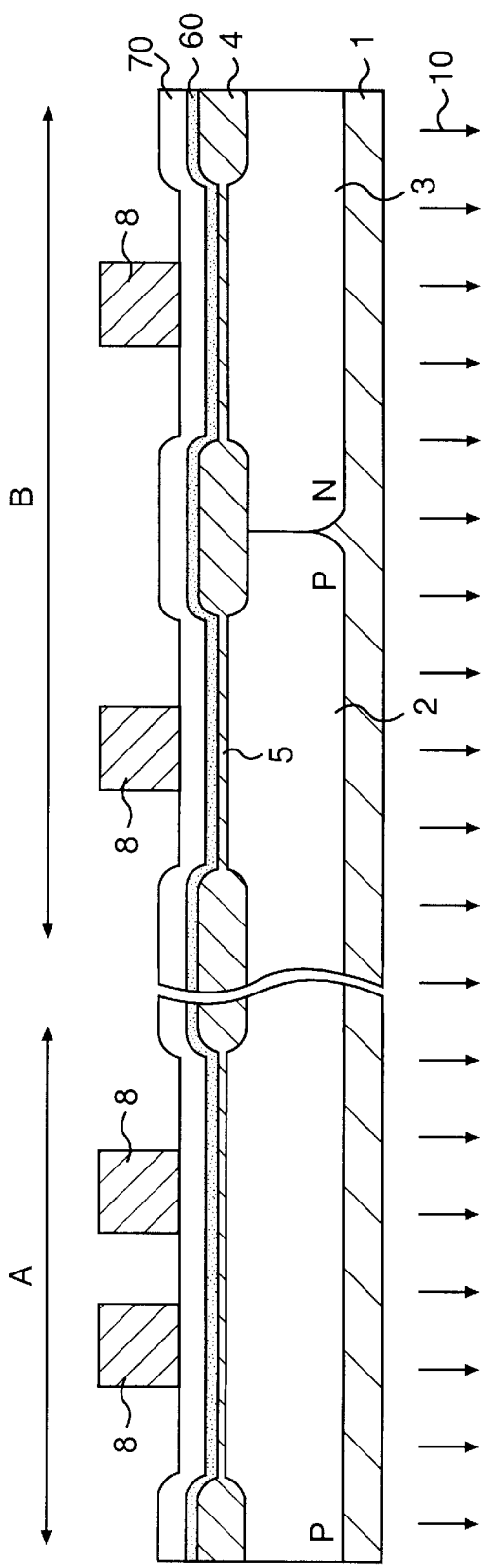
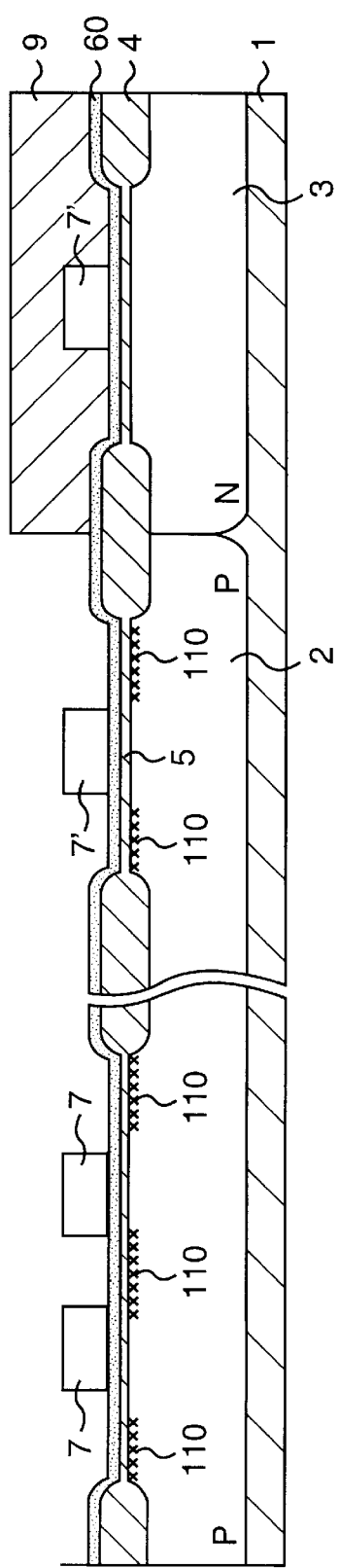
FIG. 7a
FIG. 7b

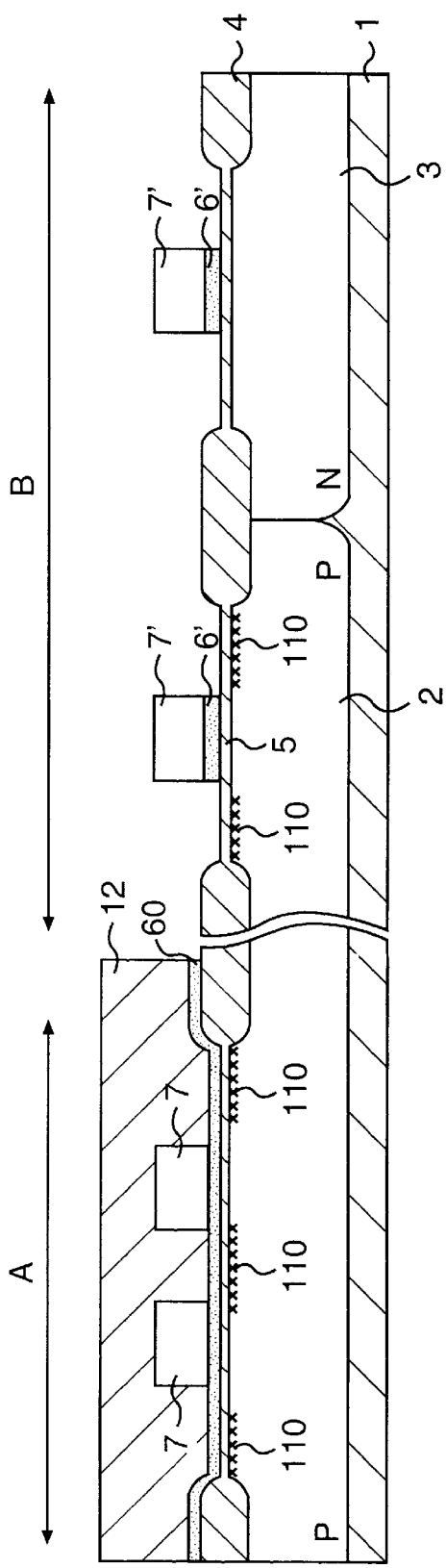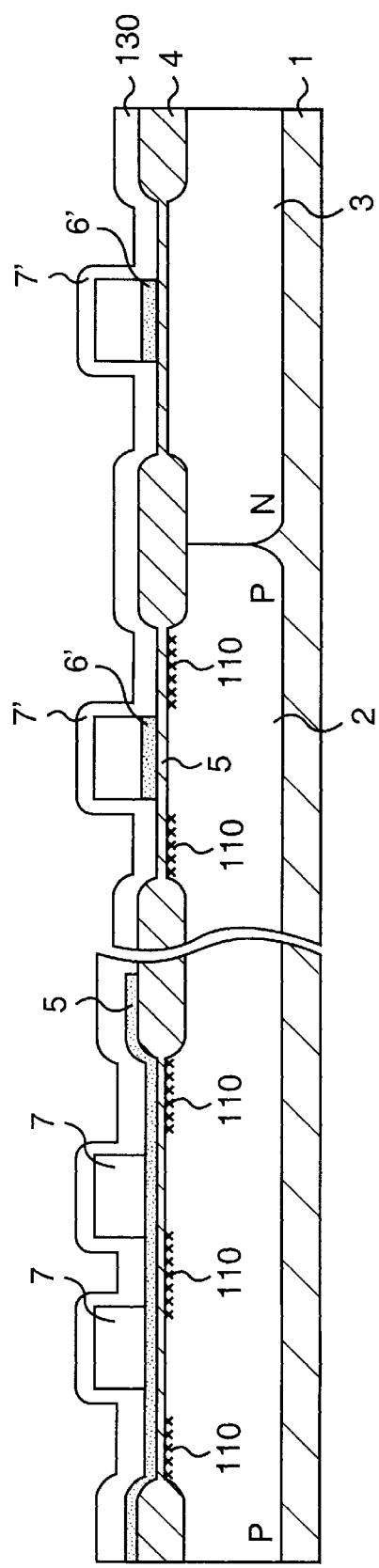
FIG. 8a
FIG. 8b

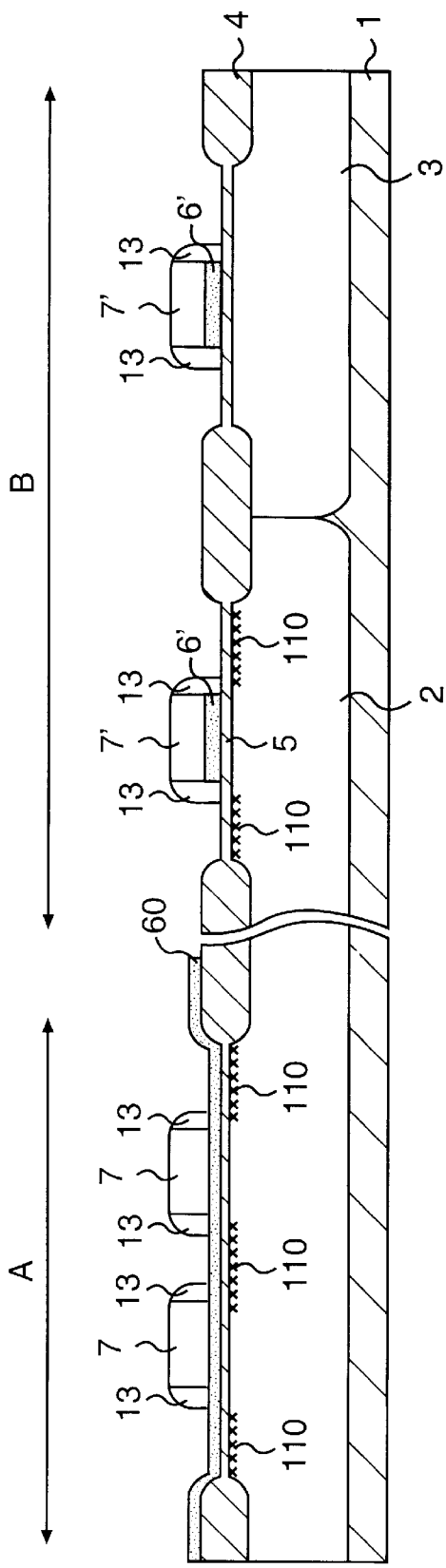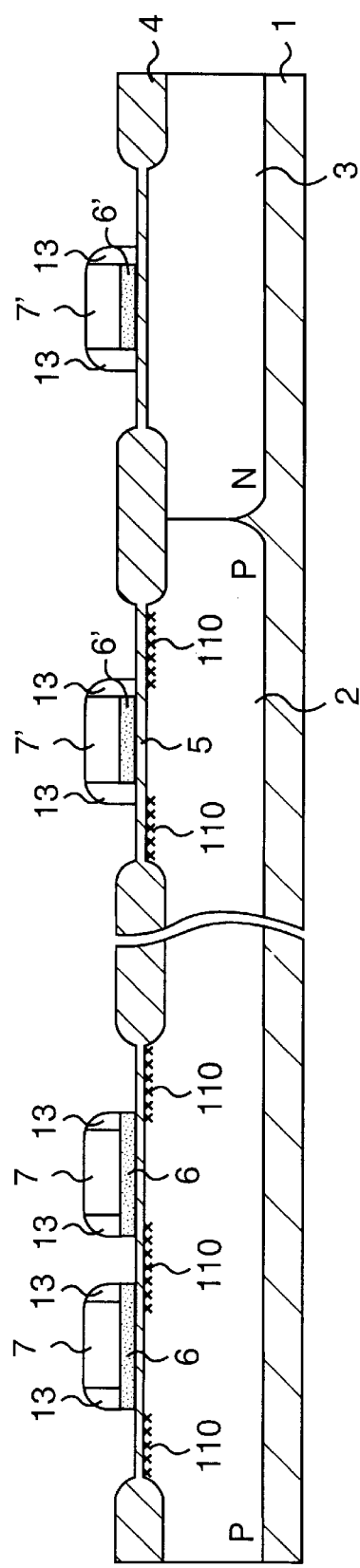

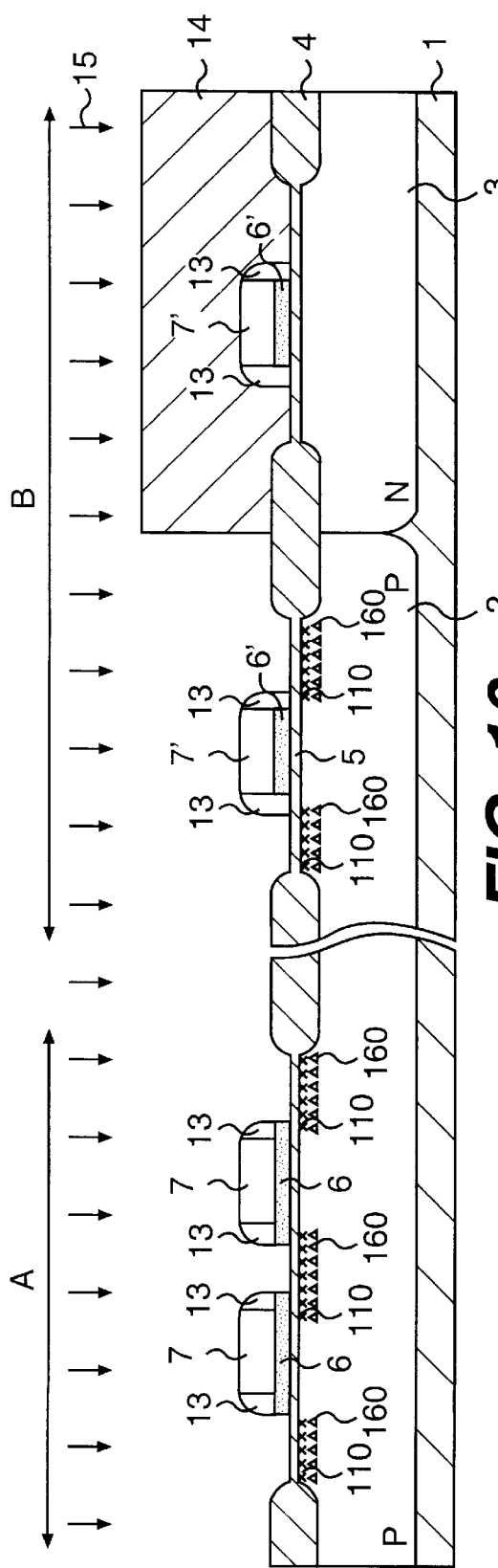
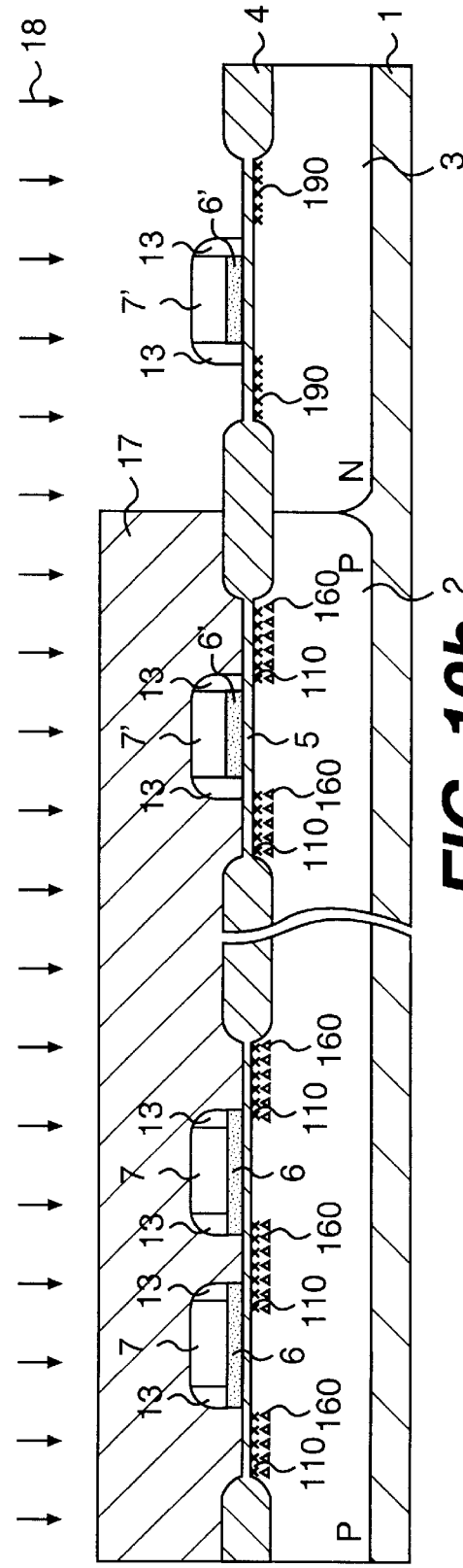

GATE STRUCTURE OF SEMICONDUCTOR MEMORY

BACKGROUND OF THE INVENTION

1. Field of the Invention

The present invention relates to a semiconductor having a Lightly Doped Drain structure (hereinafter referred to as a LDD structure) capable of being formed with a high density, more particularly to a gate structure of a semiconductor memory such as a Static Random Access Memory (hereinafter referred to as a SRAM) exhibiting little soft errors.

2. Description of the Related Art

The semiconductor memory is composed of a memory cell array including memory cells arranged in a matrix fashion and a peripheral circuit which controls an operation to record and read out data to/from the memory cell. The conception figure of the semiconductor memory is shown in FIG. 1. Transistors which are formed in the semiconductor memory and used for the uses other than particular ones are constituted such that they have the same size and structure to simplify manufacturing steps, without depending on whether they constitute the memory cell or the peripheral circuit.

Referring to FIGS. 2 and 3, the conventional technologies will be described. FIG. 2 is a part of the conventional semiconductor memory, which is a sectional view showing a MOS region of a memory cell driver disposed in the memory cell area A of a SRAM and NMOS and PMOS regions of a peripheral circuit area B thereof. FIG. 3 is a circuit diagram of a SRAM cell of an enhanced resistor type (hereinafter referred to as an E/R type). As shown in FIG. 2, a P well 2 and a N well 3 are formed in a surface region of a semiconductor substrate 1 which is formed of silicon. A field oxide film ($SiO_2$) 4 is formed on the surface of the substrate 1, which is a region serving to electrically separate adjacent elements. The memory cell area A and the peripheral circuit area B are formed in the semiconductor substrate 1. Driver transistors Q1 and Q2 are formed in the memory cell area A. A N-channel transistor NMOS and a P-channel PMOS transistor are formed in the peripheral circuit area B.

In the P well 2 of the memory cell area A, formed are an $N^+$ diffusion region 16 used for source/drain regions and an $N^-$ diffusion region 11 serving as an LDD region, which is overlapped with the $N^+$ diffusion region 16 and has a tip portion protruding from the $N^+$ diffusion region 16. In the peripheral circuit area B, formed are an N+ diffusion region 16 used for source/drain regions and an $N^-$ diffusion region 11 serving as an LDD region, which is overlapped with the $N^-$ diffusion layer 16 and has a tip portion protruding from the $N^+$ diffusion layer 16. An $N^+$ diffusion region 19 used for source/drain regions of the P-channel transistor PMOS is formed in the N well 3. A gate oxide film 5 is formed in the surface of the semiconductor substrate 1. A gate 71 formed of such as polysilicon is formed on the gate oxide film 5 of the memory cell area A, as well as between the source/drain regions 16 facing each other. Each of the foregoing driver transistors Q1 and Q2 is constituted by the gate 71 and the source/drain regions 16. A side wall insulating film 13 formed of a silicon oxide film is formed on the side surface of the gate 71. In the periphery circuit portion B, the gate 72 formed of such as polysilicon is formed on a gate oxide film 5 which is disposed on the P well 2, as well as between the N type source/drain regions 16 facing each other. The foregoing N channel transistor NMOS is constituted by the gate 72 and the source/drain regions 16. The side wall insulating film 13 is formed on the side surface of the gate 72.

In the peripheral circuit B, a gate 73 is formed of such as polysilicon on the gate oxide film 5 disposed on the N well 3, as well as between the P type source/drain regions 19 facing each other. The foregoing P channel transistor PMOS is constituted by the gate 73 and the source/drain regions 19. The side wall insulating film 13 formed of a silicon oxide film is formed on the side wall of the gate 73. The transistors formed on the semiconductor substrate 1 are covered with a first interlayer insulating film 20 formed of such as $SiO_2$ which is formed by a Chemical Vapor Deposition (hereinafter referred to as a CVD) method. The surface of the interlayer insulting film 20 is flattened by a Chemical Mechanical Polishing (herein after referred to as a CMP) or the like, and a polysilicon wiring 21 is formed on the flattened surface of the interlayer insulating film 20. The polysilicon wiring 21 constitutes resistors R1 and R2 of the SRAM shown in FIG. 3. A second interlayer insulating film 22 formed of $SiO_2$ or the like formed by the CVD method is formed on the first interlayer insulating film 20 so as to cover the polysilicon wiring 21. The surface of the second interlayer insulating film 22 is flattened by the CMP treatment and the like, and a metal wiring 23 formed of aluminum or the like is formed on the flattened surface of the interlayer insulating film 22. A protection insulating film 24 formed of BPSG (Boron-doped Phosphorus Silicate Glass) or the like is formed on the semiconductor substrate 1 so as to cover the metal wiring 23.

FIG. 3 is a circuit diagram of the E/R type SRAM cell. The memory cell of the SRAM stores data in a state which charges at two nodes 1 and 2, each of which is connected to the gate 71 of the corresponding transistors Q1 and Q2 of the memory cell driver. For example, when a potential at the node 1 is at a high level and the node 2 is at a low level, the memory cell indicates "0" data state. Alternately, when the node 1 is at a low level and the node 2 is at a high level, the memory cell indicates "1" data state (see FIG. 9). The charges at the node 1 where it is high in level are stored in a capacitor of a MOS structure which is constituted by the gate 71, gate oxide film 5, semiconductor substrate 1 of the driver transistors Q1 and Q2 connected to the corresponding nodes 1 and 2. Specifically, this capacitor has a structure that uses the gate oxide film as a dielectric and the gate and the semiconductor substrate as an electrode. This capacitor is more stable as its capacitance becomes larger. The reason of this is as follows. Since the amount of the charges stored in the capacitor is large when the capacitance thereof is large, the data do not come to be broken even when the charges stored in the capacitor reduces by external factors.

However, the recent miniaturization of the semiconductor devices leads to also a reduction in an area of a gate of the driver transistors Q1 and Q2, so that the capacitance of the foregoing capacitor actually reduces more and more. The reduction in the capacitance of the capacitor produces an increase in a soft error ratio created by $\alpha$ ray and the like, resulting in a severe problem to reduce reliability of a system on which the semiconductor devices such as SRAMs are mounted. Concretely, the following phenomenon occurs. When the $\alpha$ ray is entered onto the vicinity of the gate of the driver transistor, minority carriers of an opposite type to the charges stored in the gate are generated in the incidence portion of the $\alpha$ ray. The minority carriers combine with the stored charges, whereby the charges reduce. Upon a reduction in the charge, a threshold value of the driver transistor comes to reduce, leading to a undesirable inversion of data latched in the driver transistor. This phenomenon is called a soft error.

For the SRAMs, the transistors constituting the peripheral circuit thereof is required to operate at a high speed. Therefore, the gates of the transistors of the peripheral circuit have a tendency to be smaller. On the other hand, for the memory cell area, unlike the peripheral circuit area, a high operation performance is not required, but a large capacitance of the capacitor is required.

However, setting the gate length of the driver transistors to be large in order to secure the large capacitance of the capacitors is not necessarily a good idea. As shown in FIG. 2 since the driver transistors Q1 and Q2 share the source/drain regions, a distance between transistors Q1 and Q2 is small. Therefore, a limitation to a precision of lithography processes for making the gates of the driver transistors degrades a precision in making the gates thereof. For the reason described above, securing the capacitance of the capacitors of the driver transistors in the memory cell area without degrading the precision in making the gates thereof is a key to the miniaturization of SRAMs and the like.

SUMMARY OF THE INVENTION

The present invention was invented in consideration of the foregoing circumstances. The object of the present invention is to provide a structure which is capable of securing a sufficient capacitance of capacitors of driver transistors in a memory cell area of miniaturized semiconductor memorys such as SRAMs and a manufacturing method of the same.

To achieve the above object, the present invention provides a semiconductor memory comprising a memory cell area which comprises a first transistor including a first source/drain region, a first gate insulating film formed on a semiconductor substrate, a first gate electrode formed on said first gate insulating film, a second gate electrode formed on said first gate electrode, said second gate having a smaller size than that of said first gate electrode, and a first insulating film formed on said first gate electrode so as to contact with a side wall of said second electrode, and a peripheral circuit area which comprises a second transistor including a second source/drain region; a second gate insulating film formed on the semiconductor substrate, a third gate electrode formed on said second gate insulating film, said third gate electrode being formed of the same material as that of said first gate electrode, a fourth gate electrode formed on said third gate electrode, the fourth gate electrode being formed of the same material as that of said second gate electrode, and a second insulating film formed so as to contact with a side wall of said third gate electrode and a side wall of said fourth gate electrode.

Other objects, features, and advantages of the present invention will become apparent from the following detailed description. It should be understood, however, that the detailed description and specific examples, while indicating preferred embodiment of the invention, are given by way of illustration only, since various changes and modifications within the spirit and scope of the invention will become apparent to those skilled in the art from this detailed description.

BRIEF DESCRIPTION OF DRAWINGS

A more complete appreciation of the present invention and many of its attendant advantages will be readily obtained by reference to the following detailed description considered in connection with the accompanying drawings, in which.

FIG. 7 shows a part of manufacturing steps of the semiconductor memory of the present invention;

FIG. 8 is a part of the manufacturing steps of the semiconductor memory of the present invention;

FIG. 9 is a part of the manufacturing steps of the semiconductor memory of the present invention; and FIG. 10 is a part of the manufacturing steps of the semiconductor memory of the present invention.

DETAILED DESCRIPTION OF PREFERRED EMBODIMENTS

Embodiments of the present invention will be described in detail with reference to the drawings.

Figure 4:
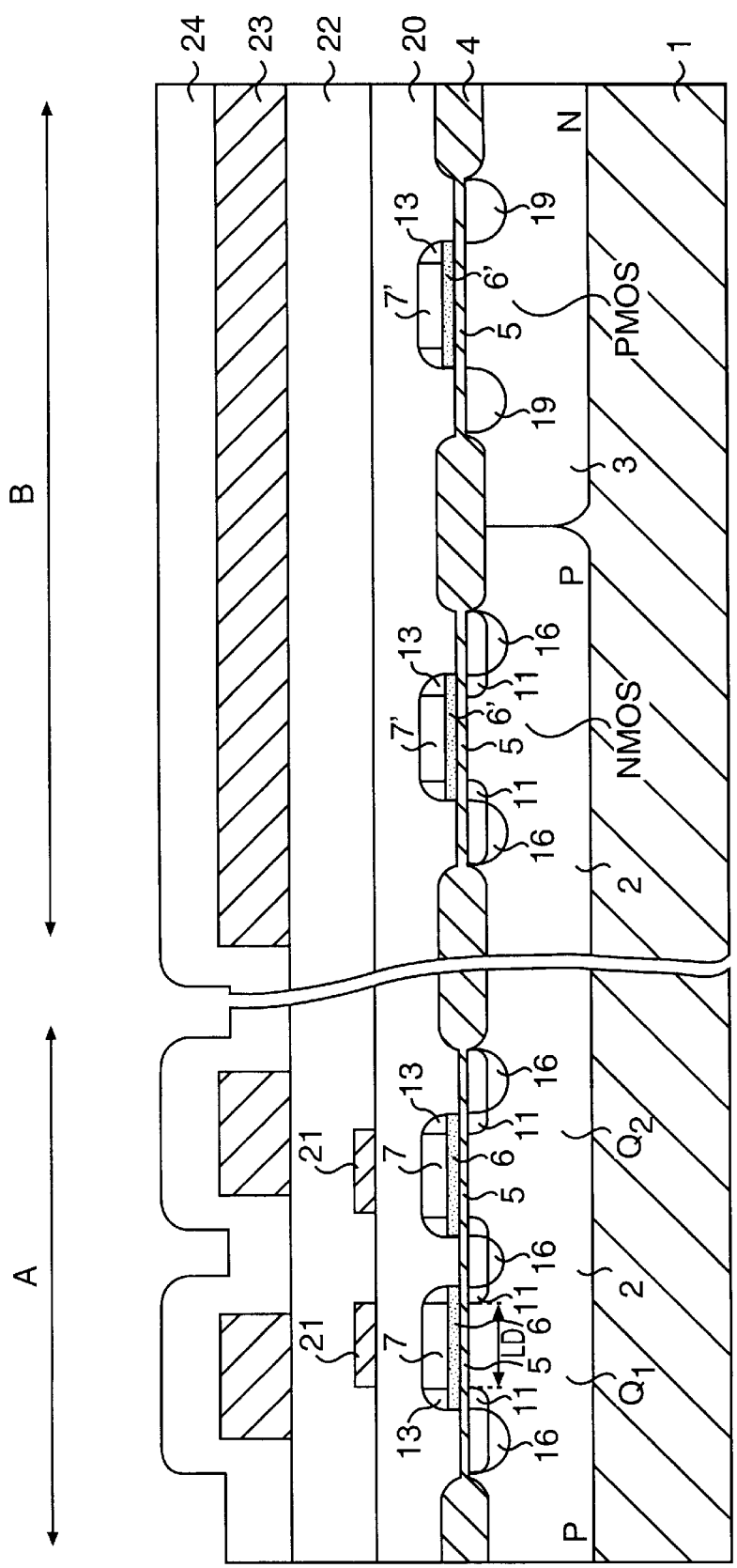
FIG. 4 is a sectional view of a semiconductor memory of the present invention.
Figure 5:
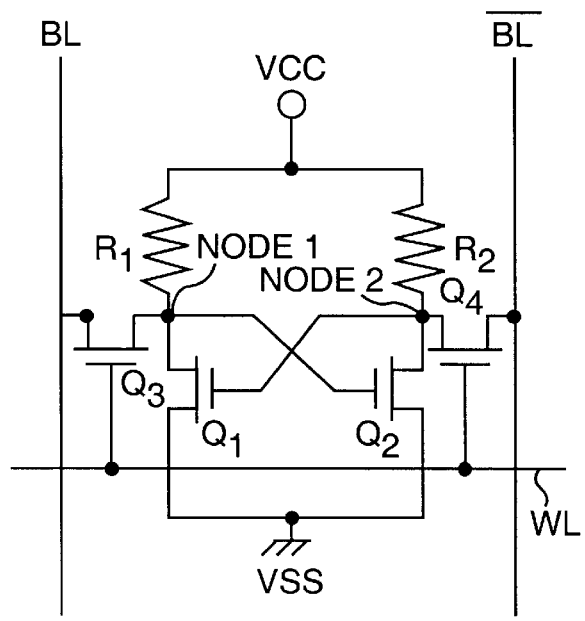
FIG. 5 is a circuit diagram of a memory cell of the semiconductor memory of the present invention.

First, an example of a semiconductor memory formed on a semiconductor substrate will be described with reference to FIGS. 4 and 5. FIG. 4 is a part of the semiconductor memory of the present invention. Specifically, FIG. 4 is a sectional view of an MOS region in which driver transistors are formed in a memory cell area A and NMOS and PMOS regions of a peripheral area B. FIG. 5 is a circuit diagram of an enhanced resistor type SRAM cell.

As shown in FIG. 4, P and N-well regions 2 and 3 are formed in a surface region of a semiconductor substrate 1 formed of silicon and the like. Moreover, a field oxide film ($SiO_2$) 4 is formed on the surface of the semiconductor substrate 1, which serves as a region to electrically separate adjacent elements from each other. A memory cell area A and a peripheral circuit area B are formed in this semiconductor substrate 1. Driver transistors Q1 and Q2 are formed in the memory cell area A. An N channel transistor NMOS and a P channel transistor PMOS are formed in the peripheral circuit area B. $N^+$ diffusion regions 16 used for source/drain regions are formed in the P well region 2 of the memory cell area A, and $N^-$ diffusion regions 11 constituting LDD regions are formed in the $N^+$ diffusion regions 16, each of which overlaps with the corresponding one of the $N^+$ diffusion regions and has a tip portion protruding therefrom.

In the peripheral circuit area B, $N^+$ diffusion regions 16 constituting source/drain regions are formed in the P well region 2, and $N^-$ diffusion regions 11 are formed therein, each of which overlaps with the corresponding one of the $N^+$ diffusion regions 16 and constitutes the corresponding one of the LDD regions having a tip portion protruding from the $N^+$ diffusion region 16. In the N well region 3, P+ diffusion regions 19 are formed which constitute source/drain region. A gate oxide film 5 is formed on the surface of the semiconductor substrate 1. In the memory cell area A, a gate is formed on the gate oxide film 5 and between the N type source/drain regions 16. The gate and the source/drain regions constitute each of the foregoing transistors Q1 and Q2. In the P well 2 of the peripheral circuit area B, a gate is formed on the gate oxide film 5 and between the N type source/drain regions 16. The foregoing N channel transistor NMOS is formed by this gate and the source/drain regions. In the N well region 3 of the peripheral circuit area B, a gate is formed on the gate oxide film 5 between the P type source/drain regions 19. The foregoing P channel transistor PMOS is constituted by this gate and the source/drain regions.

Next, the description of the gate structure will be described. Each gate of the memory cell driver transistors Q1 and Q2 of the memory call area A is constituted by first and second gates layers 6 and 7. The first gate layer 6 is formed on the gate oxide film 5, which has a thickness of about 60 Å and a gate length, that is, a width of the gate, of about 0.41 μm. The second gate layer 7 is formed on the first gate layer 6, which has a gate length, that is, a width of the gate, of about 0.25 μm. No side wall insulating film is formed on the side of the first gate layer 6, and a side wall insulating film 13 of a width of about 0.08 μm is formed on the second gate layer 7. Specifically, the second gate layer 7 and the side wall insulating film 13 of the layer 7 are provided on the first gate layer 6 in order that the second gate layer 7 and the side wall insulating film 13 cover the entire surface of the first gate layer 6. Each of the source/drain regions 16 formed in the surface region of the semiconductor substrate 1 extends into the portion below the corresponding one of the first gate layers 6. Since the capacitance is determined depending on an area of the first gate layer 6, it is sufficient that the gate length of the second gate layer 7 and the channel length LD are actually shorter than that of the first gate layer 6, as long as the capacitance can be secured with this area of the first gate layer 6. Supposing that the limitation to least occurrence of the soft errors is more than 0.4 μm, while the gate length has to be at least 0.4 μm in conventional gate, the first gate layer 6 extending to the portion below the side wall insulating film 13 is formed in the present invention so that the gate length of the second gate layer 7 can be shortened to be at least two times of a thickness of the side wall insulating film compared to the conventional semiconductor memory.

Each of the gates of the N and P channel transistors of the peripheral circuit area B is formed directly on the corresponding one of the gate oxide films 5 having a thickness of about 60 Å. Each gate consists of the first gate layer 6' having a gate length of about 0.25 μm and the gate layer 7' formed on the first gate layer 6', which has a gate length of about 0.25 μm. The first and second gate layers 6' and 7' have the same shape and area. The side wall insulating film 13 is formed so as to stretch over both of the first and second gate layers 6' and 7'.

As a matter of course, in the present invention, the transistors in the peripheral circuit area B may employ the gates possessing the features of the present invention that the size of the second gate layer is smaller than that of the first gate layer. Alternately, the gates of the peripheral circuit area B may be the gate of one layer structure as well as the gate of the conventional structure. However, in the peripheral circuit area B, since the transistors have to possess a high operation performance and the soft errors needs not to be considered, the gate length of the first gate layers of the transistors in the peripheral circuit area B should be the same as that of the second gate layers.

The transistor group on the semiconductor substrate 1 are covered with a first interlayer insulating film 20 formed of a material such as $SiO_2$, which is formed by a CVD method. This interlayer insulating film 20 is flattened by a CMP and the like, and a polysilicon wiring 21 is formed on the flattened surface of the semiconductor substrate 1. The polysilicon wiring 21 constitutes resistors R1 and R2 of the SRAM shown in FIG. 5. A second interlayer insulating film 22 formed of SiO2 or the like formed of the CVD method is formed on the first interlayer insulating layer 20 so as to cover the polysilicon wiring 21. The interlayer insulating film 22 is flattened by the CMP and the like. A wiring 23 formed of a metal such as aluminium is formed on the flattened surface of the semiconductor substrate 1. A protection insulating film 24 such as BPSG is formed on the semiconductor substrate 1, so as to cover the wiring 23.

Figure 6:
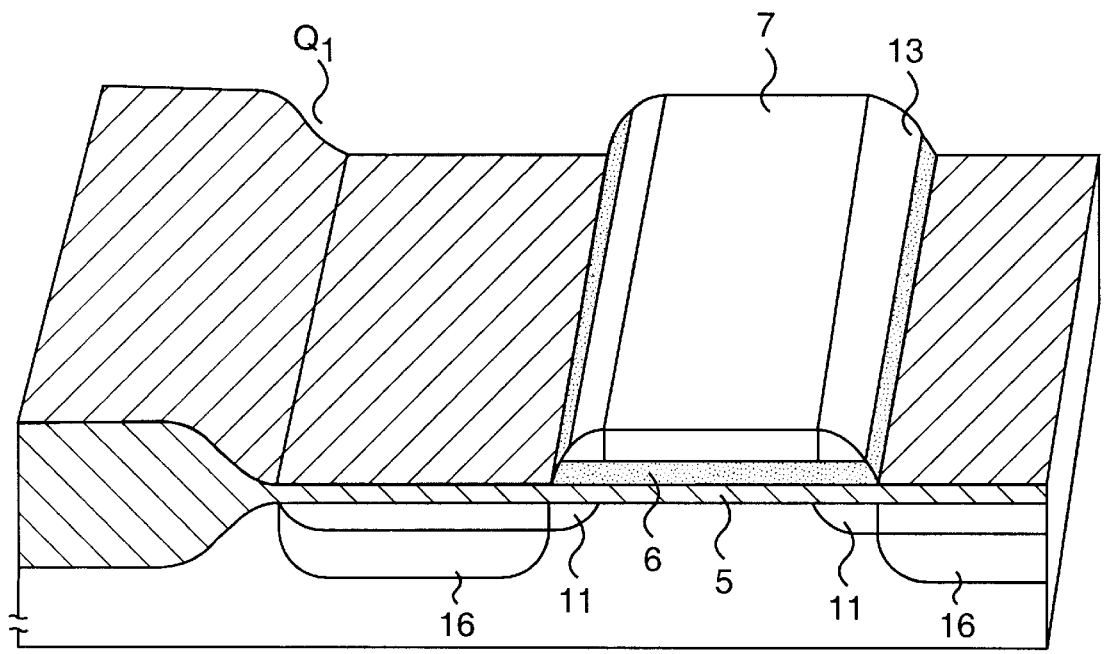
FIG. 6 is a perspective view of a transistor in the memory cell of the semiconductor memory of the present inventions.

FIG. 6 is a perspective view of the memory cell driver transistor Q1 of the memory cell area A formed on the semiconductor substrate 1 of FIG. 4. FIG. 5 is a circuit diagram of the SRAM of the semiconductor memory of FIG. 4. Referring to FIGS. 4 and 5, the circuit structures of the memory call driver transistors Q1 and Q2 of the SRAM formed in the semiconductor substrate 1 will be described. The memory cell driver transistors Q1 and Q2 formed in the memory cell area A constitute the SRAM cell. This memory cell comprises four N channel MOS transistors, that is, first and second MOS transistors Q1 and Q2, and third and fourth transistors Q3 and Q4; and two high resistance resistors, that is, first and second R1 and R2. The first resistor R1 has one terminal connected to a power source voltage at a high potential level ($V_{cc}$) and the other terminal connected to a node 1. The second resistor R2 has one terminal connected to the $V_{cc}$ and the other terminal connected to a node 20 The third MOS transistor Q3 is connected to a first bit line BL in one side of the source/drain region and to the node 1 in the other side thereof. Moreover, the gate of the third MOS transistor Q3 is connected to a word line WL. The fourth MOS transistor Q4 is connected to a second bit line /BL (symbol / denotes an inversion signal) in one side of the source/drain region thereof and to a connection point (node 2) of the second resistor R2 and the second MOS transistor Q2. The gate of the fourth MOS transistor Q4 is connected to the word line WL. The gate of the first MOS transistor Q1 is connected to the node 2, and the one side of the source/drain region thereof is connected to the node 1. The other side of the source/drain region is connected to the GND (substrate potential). The gate of the second MOS transistor Q2 is connected to the node 1 and the one side of the source/drain region is connected to the node 2. The other side of the source/drain region is connected to the GND.

The transistors Q1 and Q2 constitute a latch circuit and used as the driver transistors of the memory cell area. The transistors Q3 and Q4 are used as transfer gates for transferring data latched by the transistors Q1 and Q2 to the bit lines BL and /BL, when the data is read out. The nodes 1 and 2 are used for storing the data.

Figure 1:
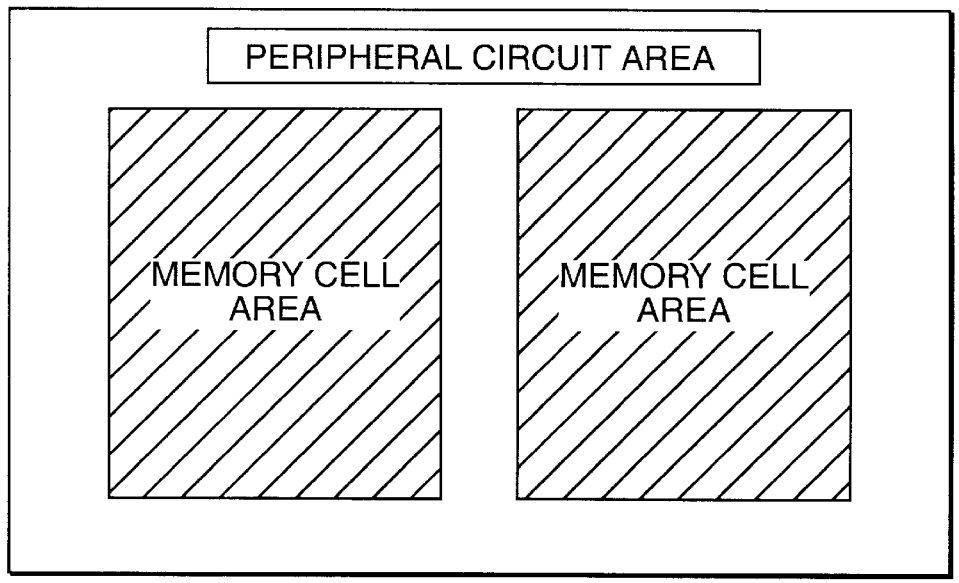
FIG. 1 is a conceptional view of a semiconductor memory.
Figure 3:
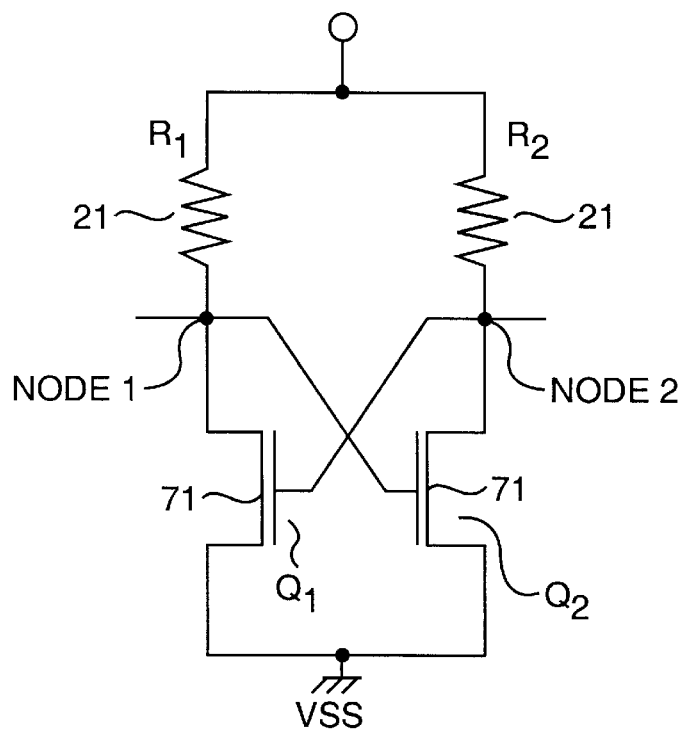
FIG. 3 is a circuit diagram of a memory cell of a conventional memory device.
Figure 2:
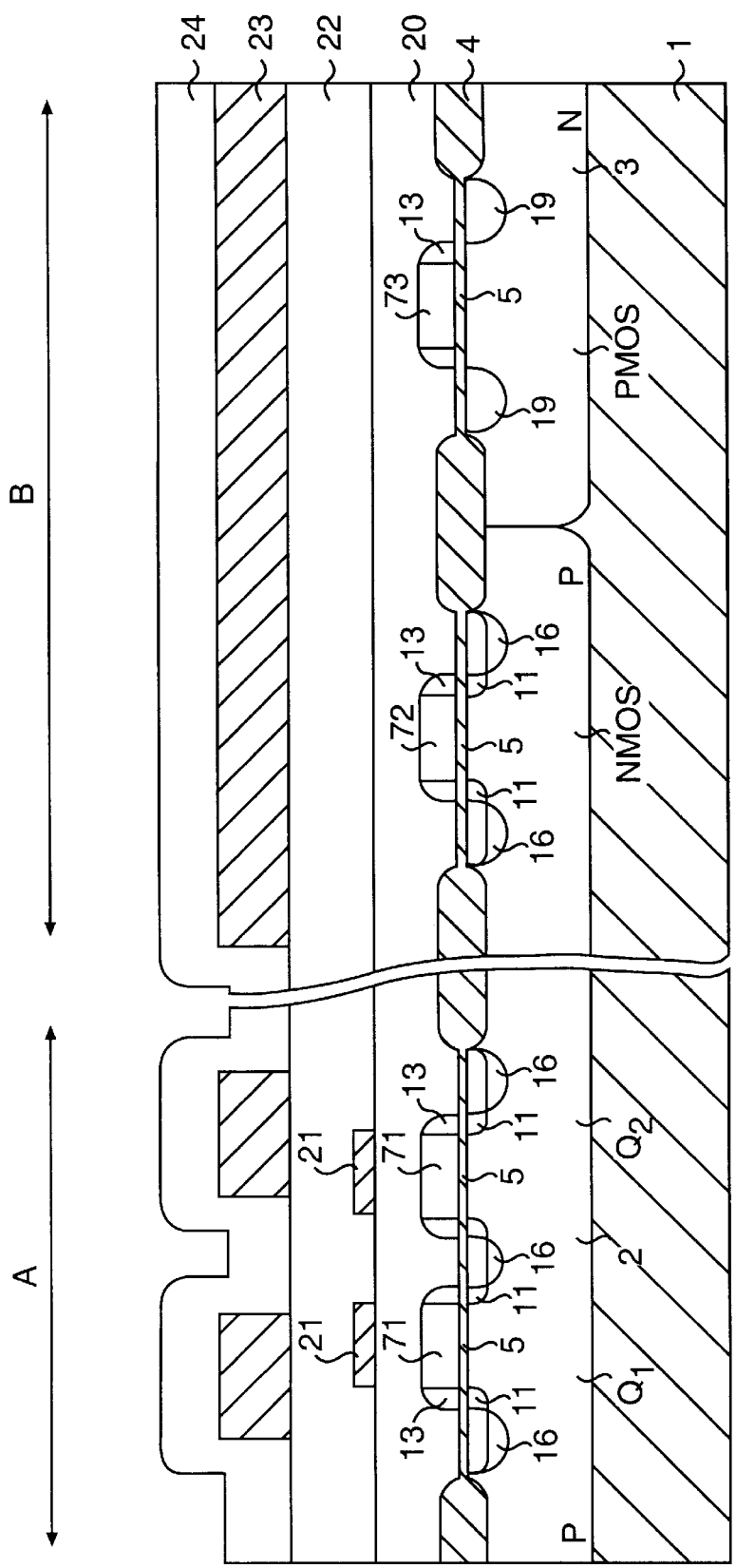
FIG. 2 is a sectional view of a conventional semiconductor memory.

In this embodiment, polysilicon is used for a material of the first gate layer, and silicide such as MoSi and WSi is used for the second gate layer. As a matter of course, in the present invention, the gate materials are not limited to these. In the present invention, insulation substances such as $SiO_2/Si_3N_4$ are used for the side wall insulating material of the gates. In the SRAM memory cell, as described in FIG. 3, the driver transistor 71 is retired to possess a large capacitance between the gate and the semiconductor substrate, rather than a high speed performance. Therefore, as the present invention, the gate having the structure in which the area of the first gate layer is set to be large enough to allow the operation of the memory to be stable.

Next, referring to FIGS. 7 to 10, an example of a manufacturing method of the semiconductor memory of the present invention will be described. First, impurities are diffused into the surface region of the silicon semiconductor substrate 1 to form the P and N well 2 and 3 having a depth of 4 μm from the surface of the substrate 1. Subsequently, a field oxide film 4 is selectively formed in the surface of substrate by a well known technique such as a LOCOS method. Next, a gate oxide film 5 is formed on the surface of the substrate 1 by a thermal oxide method. Following this, a polysilicon film 60 of a thickness of about 100 nm is formed on the entire surface of the semiconductor substrate 1. Next, a tungsten silicide (WS) film 70 of a thickness of about 150 to 200 nm is formed on the polysilicon film 60. Than, a photoresist 8 patterned to the shape of the gate is formed on the tungsten silicide film 70 (FIG. 7(a)).

Thereafter, the tungsten silicide film 70 is patterned using the photoresist 8 as a mask, thereby forming second gate layers 7 and 7'. Specifically, the second gate layer 7 is formed in the memory cell area A, and the second gate layer 7' is formed in the P well 2 and the N well 3 in the peripheral circuit area B using, for example, RIE (Reactive Ion etching). Subsequently, after the photoresist 8 is removed, a photoresist 9 having a pattern to cover the N well 3 in the peripheral circuit area B is formed on the semiconductor substrate 1. Then, phosphorus ions are injected into the surface of the semiconductor substrate 1 at an acceleration energy of 60 KeV and at a dopant dose of $4 \times 10^{13}$ cm$^{-2}$, whereby a low concentration phosphorus ion injection layer 110 is formed on both sides of the first gate layers 7 and 7' in the P wells 2 of the memory cell area A and the peripheral circuit area B (FIG. 7(b)).

The photoresist 9 is removed by a method such as ashing and the like. After the photoresist 9 is removed, a photoresist 12 having a pattern to cover the memory cell area A is formed on the semiconductor substrate 1. Using this photoresist 12, the second gate layer 7' is processed. The polysilicon film 60 is etched using this second gate layer 7' as a mask. After etching, a first gate layer 6' having the same area and shape as those of the second gate layer 7' is formed under the second gate layer 7'. The gate of the transistor of the peripheral circuit area B is constituted by the first and second gate layers 6' and 7' (FIG. 8(a)).

Next, the entire surface of the semiconductor substrate 1 is covered with a silicon oxide film 130 of a thickness of 0.08 μm after removing the photoresist 12 (FIG. 8(b)).

When it is intended to remove this silicon oxide film 130 by an anisotropic etching technique such as RIE, the silicon oxide film 130 is partially left along the side walls of the gates 7 and 7', that is, the side wall insulating film 13 is left thereon. For the gate of the transistor of the memory cell area A, the side wall insulating film 13 is formed only along the side wall of the second gate layer 7. For the gate of the transistor of the peripheral circuit area B, the side wall insulating film 13 is formed on the side walls of the first and second gate layers 6' and 7' stacked upon one another (FIG. 9(a)).

Using the side wall insulating film 13 and the gate layer 7 as mask, the polysilicon film 60 is etched. By this etching processing, the first gate layer 6 is formed under the second gate layer 7 and the side wall insulating film 13. This first gate layer 6 has a plane surface which has an area equal to a sum of areas of the second gate layer 7 and the side wall insulating film 13 (FIG. 9(b)).

Next, a photoresist 14 covering the entire of the N well 3 of the peripheral circuit area B is formed on the semiconductor substrate 1. Subsequently, arsenic ions 15 are ion-implanted into the surface of the semiconductor substrate 1 under the conditions of an acceleration energy of 60 KeV and a dopant dose of $1 \times 10^{16}$ cm$^{-2}$, whereby a high concentration arsenic ion injected layer 160 is formed on regions of the semiconductor substrate 1 around the first gate layers 6 and 6' formed on the P wells 2 of the memory cell area A and the peripheral circuit area B (FIG. 10(a)).

The photoresist 14 is removed by a method such as ashing and the like. After the photoresist 14 is removed, a photoresist 17 covering the entire of the P well 2 is formed on the semiconductor substrate 1.

Subsequently, boron fluoride (BF$_2$) ions 18 are ion-implanted into the surface of the semiconductor substrate 1 under the conditions of an acceleration energy of 60 KeV and a dopant dose of $1 \times 10^{16}$ cm$^{-2}$, thereby forming a high concentration boron fluoride ion injected layer 19O in the regions of the semiconductor substrate 1 around the first gate layer 6' on the P well 3 of the peripheral circuit area B (FIG. 10(b)).

After the photoresist 17 is removed, the semiconductor substrate 1 is subjected to an annealing treatment. With this annealing treatment, the low concentration phosphorus ion injected layer 110 forms an N$^-$ impurity diffusion region 11 of the LDD structure. The high concentration arsenic ion injected layer 160 forms an N$^+$ impurity diffusion region 16 of the source/drain region. Then, the high concentration boron fluoride ion injected layer 190 forms a P$^+$ impurity diffusion region 19. Thereafter, the SRAM integrated circuit is completed according to ordinary manufacturing steps for MOS integrated circuits (see FIG. 4).

According to the above-described method, the capacitance of the transistors of the peripheral circuit area B is set to be small, whereby the high operation performance of the peripheral circuit area B is secured. while securing the high operation performance of the peripheral circuit area B, the gate length of the gates of the driver transistors in the memory cell area A is set to be large, whereby the capacitance of the driver transistors can be increased. Therefore, it is possible to enhance a resistance to the soft errors in the SRAM memory cell without lowering an access time.

As described above, according to the present invention, the size of the memory cell can be reduced without degrading characteristics of the memory cell transistors so that it becomes possible to reduce the chip size and the cost thereof.

While there has been illustrated and described what are presently considered to be preferred embodiments of the present invention, it will be understood by those skilled in the art that various changes and modifications may be made, and equivalents may be substituted for devices thereof without departing from the true scope of the invention. In addition many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention include all embodiments falling within the scope of the appended claims.

What is claimed is:

1. A semiconductor memory comprising:
   a memory cell area comprising,
      a first transistor including a first source/drain region; a first gate insulating film formed on a semiconductor substrate; a first gate electrode formed on said first gate insulating film; a second gate electrode formed on said first gate electrode, said second gate electrode having a size smaller than that of said first gate electrode; and a first insulating film formed on said first gate electrode so as to contact with a side wall of said second gate electrode, and
   a peripheral circuit area comprising,
      a second transistor including a second source/drain region; a second gate insulating film formed on the semiconductor substrate; a third gate electrode formed on said second gate electrode, said third gate insulating film being formed of the same material as that of said first gate electrode; a fourth gate electrode formed on said third electrode, said fourth gate electrode being formed of the same material as that of said second gate electrode; and a second insulating film formed so as to contact with a side surface of said third gate electrode and a side surface of said fourth gate electrode.

2. The semiconductor memory according to claim 1, wherein said first and second source/drain regions have a lightly-doped drain structure.

3. The semiconductor memory according to claim 1, wherein a capacitance of a capacitor in which said first gate insulating film is formed of dielectrics and said first gate layer and said semiconductor substrate constitute a pair of electrodes is larger than that of a capacitor in which said second gate layer and said semiconductor substrate constitute a pair of electrodes.

4. The semiconductor memory according to claim 3, wherein said first gate layer is formed of polysilicon, and said second gate layer is formed of metal silicide.

5. The semiconductor memory according to claim 1, wherein said memory cell area comprises a driver transistor and a data transfer transistor.

6. A static semiconductor memory comprising:
- a first transistor including a first source/drain region; a first gate insulating film formed on a semiconductor substrate; a first gate electrode formed on said first gate insulating film; a second gate electrode formed on said first gate electrode, said second gate electrode having a size smaller than that of said first gate electrode; and a first insulating film formed on said first gate electrode so as to contact with a side surface of said second gate electrode;
- a second transistor including a second source/drain region; a second gate insulating film formed on the semiconductor substrate; a third gate electrode formed on said second gate insulating film, said third gate electrode being formed of the same material as that of said first gate electrode; a fourth gate electrode formed on said third electrode, said fourth gate electrode being formed of the same material as that of said second gate electrode and having a smaller size than that of said third gate electrode; and a second insulating film formed on said third gate electrode so as to contact with a side surface of said fourth gate electrode; and
- a third transistor; and
- a fourth transistor, wherein the first inverter including said first transistor and second inverter including said second transistor intersect each other and constitute a memory cell, and one terminal of current paths of each of said third and fourth transistors is connected to corresponding one of a pair of data storage nodes of the memory cell.

7. The static semiconductor memory according to claim 6, said memory further comprising:
- a word line connected to gates of said third and fourth transistors;
- a first bit line connected to the other terminal of the current paths of said third transistor; and
- a second bit line connected to the other terminal of the current paths of said fourth transistor.

8. The static semiconductor memory according to claim 6, wherein said first and second drain regions have a LDD (Lightly-Doped Drain) structure.

9. The static semiconductor memory according to claim 6, wherein a capacitance of a capacitor in which said first gate and second insulating films are formed of dielectrics and said first and third gate layers and semiconductor substrate constitute a pair of electrodes is larger than that of a capacitor in which said second and fourth gate layers and said semiconductor substrate constitute a pair of electrodes.

10. The static semiconductor memory according to claim 9, wherein said first and third gate layers are formed of polysilicon, and said second and fourth gate layers are formed of metal silicide.

11. A semiconductor memory comprising:
- a memory cell area comprising,
  - a first transistor including a first source/drain region; a first gate insulating film formed on a semiconductor substrate; a first gate electrode formed on said first gate insulating film; a second gate electrode formed on said first gate electrode, said second gate electrode having a size smaller than that of said first gate electrode; and a first insulating film formed on said first gate electrode so as to contact with a side surface of said second gate electrode, and
- a peripheral circuit area comprising,
  - a second transistor including a second source/drain region; a second gate insulating film formed on the semiconductor substrate; a third gate electrode formed on said second gate insulating film, said third gate electrode being formed of the same material as that of said first gate electrode; a fourth gate electrode formed on said third electrodes said fourth gate electrode being formed of the same material as that of said second gate electrode; and a second insulating film formed so as to contact with a side surface of said third gate electrode and a side surface of said fourth gate electrode;
- an interlayer insulating layer covering said memory cell area and said peripheral circuit area; and
- a resistor formed on said interlayer insulating layer as well as above said first transistor.

12. The semiconductor memory according to claim 11, wherein said resistor is formed of polysilicon.

13. The semiconductor memory according to claim 11, said memory further comprising:
- first interlayer insulating layer formed on said interlayer insulating layer, said first interlayer insulating layer covering said resistor;
- a wiring layer formed on said first interlayer insulating layer; and
- a second interlayer insulating layer formed on said first interlayer insulating layer, said second interlayer insulating layer covering said wiring layer.

14. A method for manufacturing a semiconductor memory, comprising the steps of;
- forming first and second conductive films on a semiconductor substrate interposing a gate insulating film;
- patterning said second conductive film to form a second gate layer;
- ion-implanting impurities using said second gate layer as a mask to form an impurity region of a low impurity concentration;
- forming an insulating film on said semiconductor substrate so as to cover said second gate layer;
- patterning said insulating film through an anisotropic etching to partially leave said insulating film along a side surface of said second gate layer; and
- forming an impurity region of a high impurity concentration using parts of said second gate layer and said insulating film as masks.

* * * * *